(12) United States Patent
Schumm et al.

(10) Patent No.: US 10,254,185 B2
(45) Date of Patent: *Apr. 9, 2019

(54) PRESSURE SENSOR

(71) Applicant: InvenSense, Inc., San Jose, CA (US)

(72) Inventors: Johannes Schumm, Zurich (CH);
Andreas Reinhard, Dubendorf (CH);
Thomas Kraehenbuehl, Zurich (CH);
Stefan Thiele, Jona (CH); Rene Hummel, Baar (CH); Chung-Hsien Lin, Hsinchu (TW); Wang Shen Su, Tainan (TW); Tsung Lin Tang, Kaohsiung (TW); Chia Min Lin, Hsinchu (TW)

(73) Assignee: InvenSense, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/921,504

(22) Filed: Mar. 14, 2018

(65) Prior Publication Data

US 2018/0202882 A1 Jul. 19, 2018

Related U.S. Application Data

(63) Continuation of application No. 15/085,592, filed on Mar. 30, 2016, now Pat. No. 9,958,349.

(30) Foreign Application Priority Data

Apr. 2, 2015 (EP) .................................. 15000967

(51) Int. Cl.
*H01L 29/84* (2006.01)
*G01L 9/00* (2006.01)
(Continued)

(52) U.S. Cl.
CPC .......... *G01L 9/0042* (2013.01); *B81B 3/0089* (2013.01); *B81C 1/00285* (2013.01);
(Continued)

(58) Field of Classification Search
CPC .............................. H01L 29/84; G01L 9/0042
See application file for complete search history.

(56) References Cited

U.S. PATENT DOCUMENTS

| 5,334,569 A | 8/1994 | Kisalus |
| 2015/0270180 A1* | 9/2015 | Yang ............... H01L 21/823878 438/198 |
| 2016/0025583 A1* | 1/2016 | Besling ..................... G01L 9/12 73/724 |

FOREIGN PATENT DOCUMENTS

| CN | 1440504 A | 9/2003 |
| CN | 102169038 A | 8/2011 |

(Continued)

OTHER PUBLICATIONS

EP Office Action dated May 31, 2016 in EP Application No. 13005235.0.

*Primary Examiner* — Marc Anthony Armand

(57) ABSTRACT

A sensor includes a deformable membrane that deflects in response to a stimuli. The sensor further includes a capacitive element coupled to the deformable membrane. The capacitive element is disposed within an enclosed cavity of the sensor. The capacitive element changes capacitance in response to the deformable membrane deflecting. The capacitive element comprises a getter material for collecting gas molecules within the enclosed cavity.

13 Claims, 5 Drawing Sheets

(51) Int. Cl.
*B81C 1/00* (2006.01)
*B81B 3/00* (2006.01)

(52) U.S. Cl.
CPC .......... *G01L 9/0045* (2013.01); *G01L 9/0073* (2013.01); *H01L 29/84* (2013.01); *B81B 2201/0264* (2013.01); *B81B 2203/0315* (2013.01)

(56) References Cited

FOREIGN PATENT DOCUMENTS

| EP | 0155517 | A2 | 9/1985 |
| EP | 0993778 | A1 | 4/2000 |
| EP | 2135839 | A2 | 12/2009 |
| WO | 00/036387 | A1 | 6/2000 |
| WO | 03/006387 | A2 | 1/2003 |

\* cited by examiner

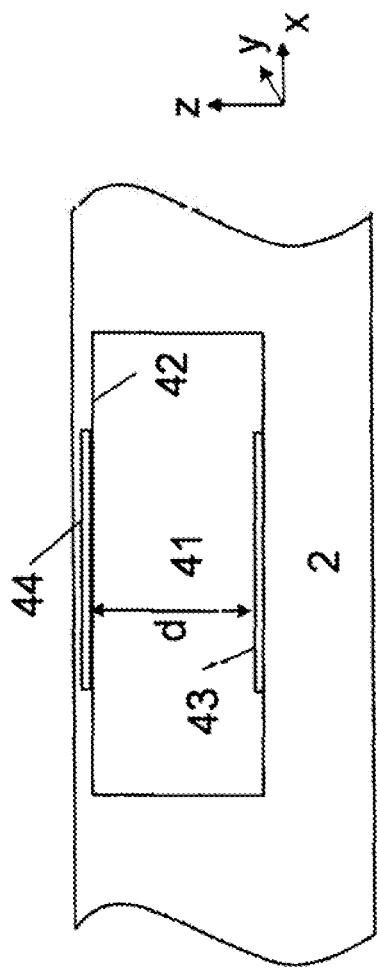
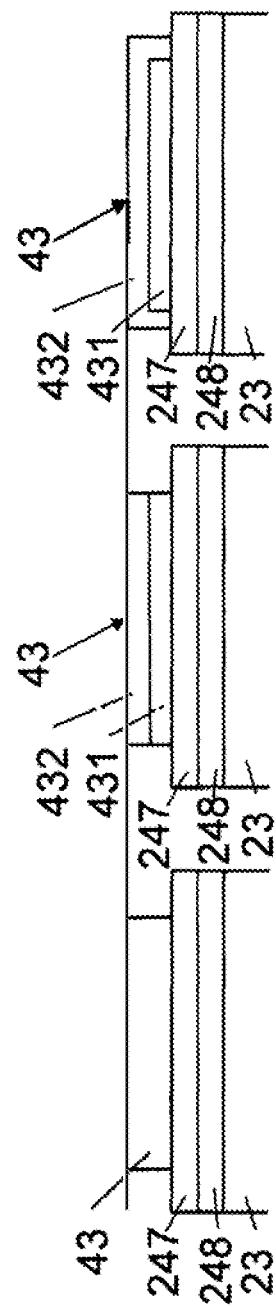

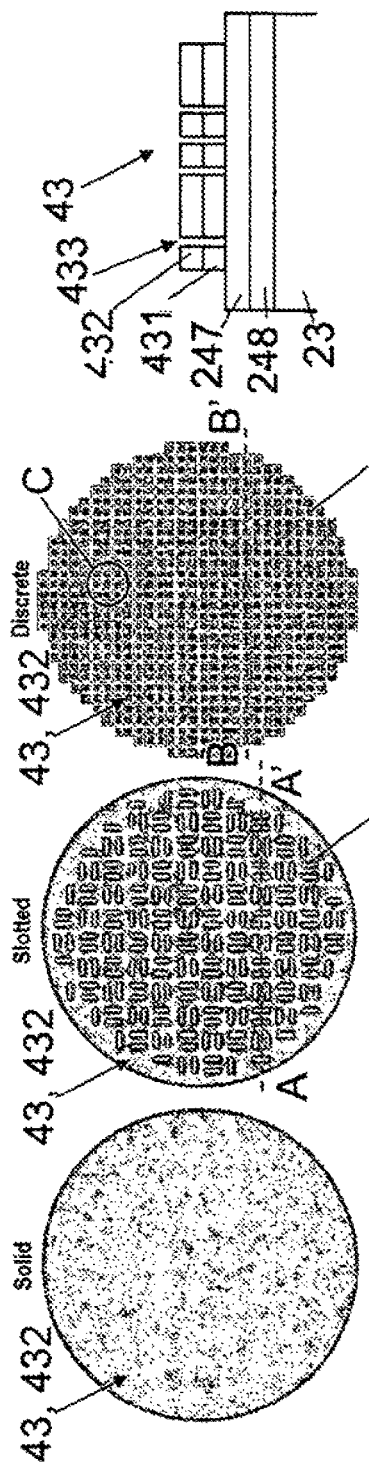

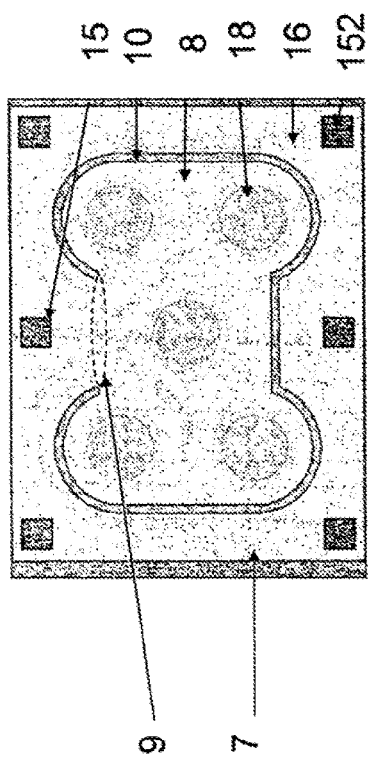
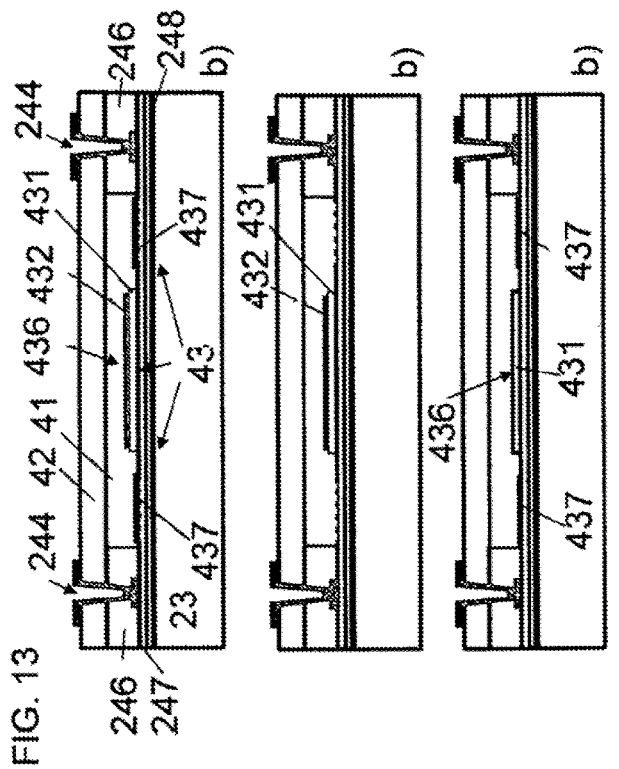
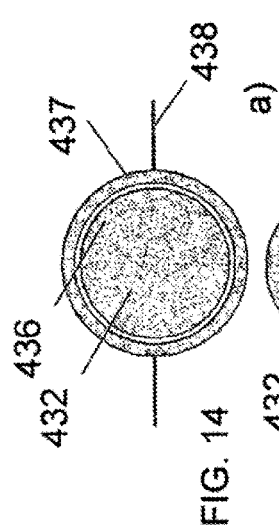
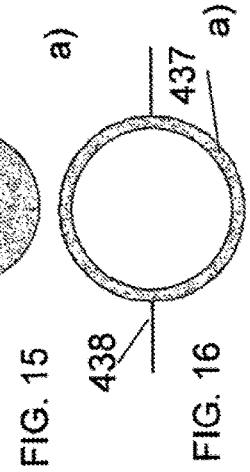
FIG. 13
FIG. 14
FIG. 15
FIG. 16

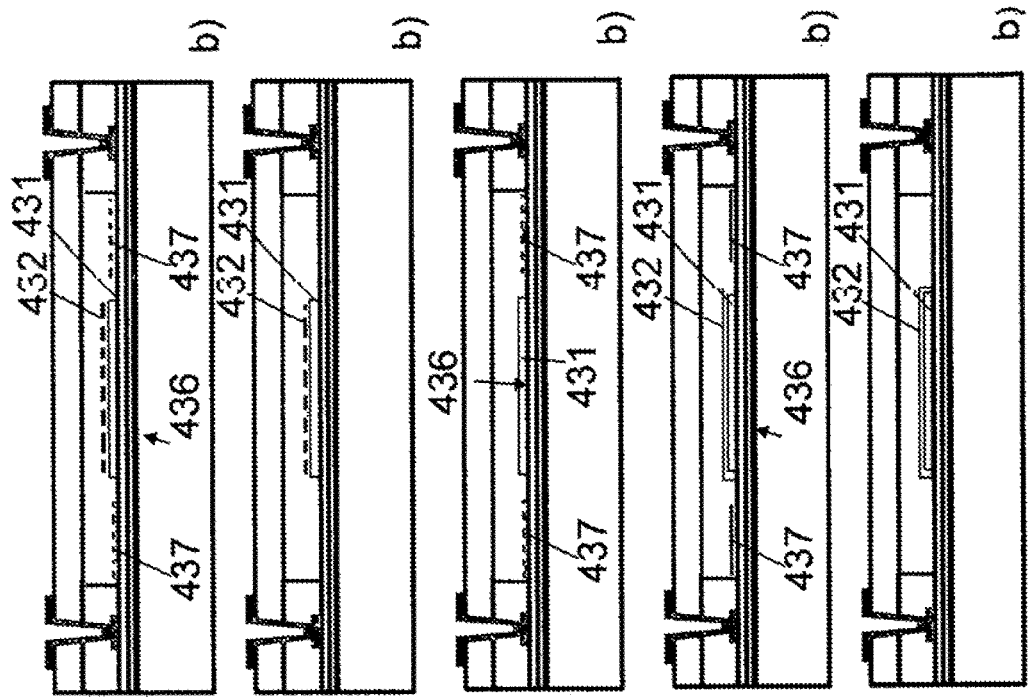
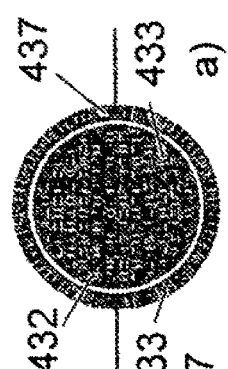
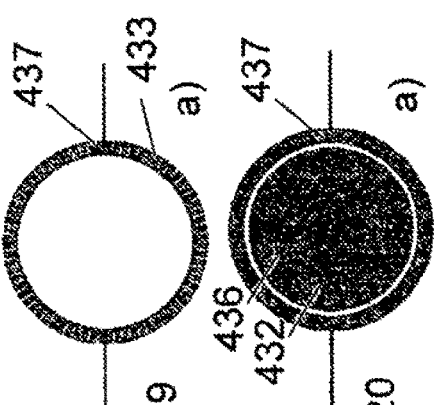
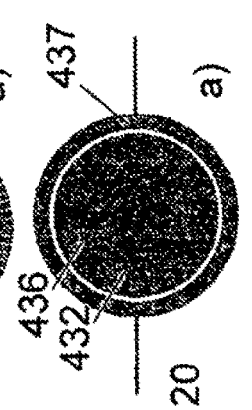
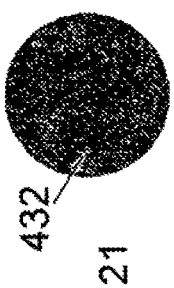
FIG. 17   FIG. 18   FIG. 19   FIG. 20   FIG. 21

PRESSURE SENSOR

REFERENCE TO RELATED APPLICATIONS

This patent application is a continuation patent application and claims the benefit and priority to the U.S. patent application Ser. No. 15/085,592, which was filed on Mar. 30, 2016. The U.S. patent application Ser. No. 15/085,592 is based on and claims priority and benefit to European Patent Application Number 15 000 967.8, which was filed on Apr. 2, 2015. The U.S. patent application Ser. No. 15/085,592 and the European Patent Application No. 15 000 967.8 are herein incorporated herein by reference in their entirety.

FIELD OF THE INVENTION

The present invention relates to a pressure sensor.

BACKGROUND OF THE INVENTION

Pressure sensors are known. Typically, a membrane is suspended over a cavity and becomes deflected in response to pressure.

However, gas molecules outgassing from the pressure sensor itself, or gas molecules entering from outside may affect defined conditions e.g. in the cavity and impact the measurement.

SUMMARY OF THE INVENTION

A pressure sensor, particularly an absolute pressure sensor, has a deformable membrane deflecting in response to pressure applied. A first, stationary electrode is provided, and a second electrode which is at least coupled to the deformable membrane. In case of pressure applied, the deformable membrane deflects and a distance between the first and the second electrode changes. Such change in distance results in a change of a capacity between the first and the second electrode which is measured and is indicative of the pressure applied.

At least one of the first and the second electrode comprises a getter material for collecting gas molecules. Preferably, only the first, stationary electrode comprises the getter material. In a different embodiment, it is only the second electrode comprising the getter material, and in a further embodiment, both electrodes comprise getter material.

By such solution, no additional space is required for a separate getter arrangement. Hence, the one or more electrodes comprising the getter material have a multi-fold function:

sensing a deflection of the membrane;

at the same time chemically binding, ad-or absorbing or otherwise collecting gas molecules that otherwise would impair the measurement;

protecting any underlying conventional non-getter electrode material, and as such preventing such material from degrading processes such as corrosion.

Additionally, the integration of the getter material into the electrode is beneficial in that electrode structures are designed to be manufactured by conventional processes, such as CMOS processes, such that the manufacturing of the getter can be integrated in standard processes, such as CMOS processes.

In a preferred embodiment, the membrane separates a cavity and a port open to an outside of the pressure sensor via which port the pressure to be measured is applied. In such arrangement, it is preferred that the first, stationary electrode is arranged inside the cavity e.g. at a bottom thereof facing the deformable membrane. Under the assumption that detrimental gas molecules may enter the cavity, the getter material of the first electrode preferably is exposed to the cavity. The cavity preferably is evacuated. In the following the getter material may keep the cavity "clean" from gas molecules for maintaining quality measurements.

The second electrode may be attached to the membrane and faces the cavity. Alternatively, the membrane may itself be electrically conducting and act as second electrode. In case of the second electrode comprising the getter material, the getter material may face the cavity.

Generally, the getter material is provided for chemically combining or ad- or absorbing gas molecules that may disturb the measurement of pressure. Such gas molecules may outgas from the pressure sensor itself, e.g. into the cavity of the pressure sensor if available. And/or gas molecules may enter the cavity from the outside, e.g. through material interfaces of the pressure sensor.

The getter material preferably is a non-evaporable metal or a non-evaporable alloy. Hence, it is preferred to use a getter material in solid form, and preferably in form of a coating. The getter material comprises or preferably consists of one of titanium, platinum, zirconium, and ZrVFe. The getter material preferably is suited to ad- or absorb or bind one or more of H, $O_2$, $N_2$, $H_2O$. Preferably, the getter material is not Al/Cu.

In case at least one of the electrodes comprises the getter material as suggested, space can be saved given that the electrodes are to be provided anyway. Instead, an additional getter coating may consume surface e.g. in the cavity of a pressure sensor which may lead to an increase of the overall size of the pressure sensor, which is not desired in particular when the pressure sensor is a pressure sensor integrated on a semiconductor substrate, e.g. in combination with processing circuitry.

As to the arrangement of the electrode that comprises the getter material, and as to the provision of the getter material in an electrode, multiple variants are suggested:

First, the subject electrode may completely consist of the getter material.

Second, the subject electrode comprises the getter material and in addition a conducting material different to the getter material. Such non-getter material preferably may be a metal such as Al/Cu as present in metal layers of a CMOS layer stack which may serve as a building block for the subject electrode. Other materials for the first layer may be W, Au, Poly-Si, doped Si, etc.

In an embodiment of the second variant, the subject electrode comprises a first layer and a second layer which second layer is made from the getter material which is deposited on the first layer. The first layer comprises conducting material different to the getter material, such as Al/Cu. The second layer may fully cover a top surface of the first layer in one embodiment, and leave side faces of the first layer exposed. Alternatively, the second layer may take the shape of a cap encapsulating the first layer at its top and additionally at its side faces such that the first layer is disconnected from the volume to collect the gas molecules from. Hence, materials can be used as first layer that may not have been used in the past in view of their degrading characteristics. Here, the getter coating may additionally protect the non-getter electrode material.

In another embodiment of the second variant, the subject electrode comprises a center portion and a ring portion around the center portion, all in the same plane. The ring portion is disconnected from the center portion by means of a gap, whereas outside the gap there may be an electrical connection between the center portion and the ring portion. This variant utilizes space best, e.g. in a cavity.

Both of the above embodiments can be applied simultaneously, i.e. the center portion and/or the ring portion may comprise the first and the second layer. In another embodiment, both the center and the ring portion consist of getter material. In embodiments where both the center and the ring portion comprise getter material, a different getter material may be applied to the ring portion than to the center portion. In a different embodiment, only one of the center portion and the ring portion consists of the getter material while the other portion consists of the conducting non-getter material, such as Al—Cu.

In case of any combinations of getter and non-getter material, it is preferred that the getter material is exposed to the volume to collect gas molecules from, e.g. the getter material faces the cavity in one example.

In a preferred embodiment of the present invention, slots are provided in the getter material of the subject electrode. The slots may e.g. have a width of less than 10 µm, and preferably between 1 µm and 3 µm. Provided that the electrode has a plane extension the slots are directed vertical through the getter material, i.e. orthogonal to the plane extension of the electrode. In the case of a layered electrode, it is preferred that the slots reach into, and preferably through the first layer underneath the second layer of getter material. The slots serve as stress reducing means given that stress may be induced from thermal manufacturing processes of the sensor as such, from the deposition of the subject electrode itself, or from the deposition of individual layers of the subject electrode if any. The material of the electrode may now expand into the slots in response to thermal impact without converting into significant stress. In addition, in particular in the two layer embodiment of the subject electrode, delamination effects of the two layers may be reduced by means of the slots.

In the case of a two portion electrode, slots may be applied to any getter material irrespective in which portion the getter material is arranged. Preferably, in case one of the portions consisting only of a conducting material different to the getter material, this portion is not provided with slots.

In a different preferred embodiment of the present invention, the subject electrode comprises multiple individual elements of the getter material, e.g. in the form of posts or pillars. Such individual elements may be arranged next to each other in a plane. Hence, the individual elements are disconnected from each other, e.g. by grooves. In case of a layered set-up of the elements, each individual element may comprise the first layer of conducting non-getter material and the second layer of the getter material deposited on the first layer. The grooves reach through both the first and the second layer.

As with the slots, the provision of the individual elements separated from each other by the grooves reduces stress and delamination. The material of the individual elements may now expand into the grooves in response to thermal impact without generating significant stress.

In one embodiment, the individual elements are disconnected from each other except for electrically conducting bridges between two neighboring individual elements. In a different embodiment, the connection may be made within the CMOS layer stack "underneath" the posts in case the individual elements are arranged on top of a CMOS layer stack. It is preferred that each individual element is electrically connected to at least one of the neighboring individual elements, in order to contact the multitude of individual elements forming the electrode by only one contact. In another variant, an individual element may be connected to all of its neighboring elements.

In a preferred embodiment of the pressure sensor, a cavity of the pressure sensor preferably is formed in a cap which cap preferably is attached to a first substrate such that the deformable membrane faces the first substrate and such that a gap is provided between the deformable membrane and the first substrate. The cap may further contain a processing circuit. A deformation of the deformable membrane is capacitively measured and converted into a signal that is supplied to and processed by the processing circuit in the cap. The first substrate contains a support portion to which the cap is attached. A contact portion of the first substrate is provided for electrically connecting the pressure sensor to the outside world. The support portion is suspended from the contact portion by one or more suspension elements. In this arrangement, the deformable membrane as element sensitive to stress in essence is mechanically decoupled from the contact portion of the first substrate via which stress may be induced from an external carrier, or during mounting of the pressure sensor to an external carrier given that the contact portion preferably is the only portion via which the pressure sensor is electrically and mechanically connected to the external carrier. Not only is the deformable membrane no longer attached to the first substrate and is integrated into the cap instead. Moreover, already a first substrate portion, i.e. the support portion is mechanically decoupled from the contact portion. On the other hand, the cap is attached, and preferably is solely attached to the support portion of the first substrate but not to the contact portion such that the membrane has no direct mechanical link to the contact portion of the first substrate. Hence, any propagation of stress induced via the contact portion of the first substrate towards the membrane is significantly reduced. In a preferred embodiment, the cap is at least partly manufactured from a second substrate. Preferably, the second substrate is a semiconductor substrate, such as a silicon substrate. Hence, the second substrate may, for example, contain a bulk material made from silicon and various layers stacked on the bulk material such as one or more of metal layers, insulation layers and passivation layers. It is preferred, that the processing circuit is integrated into the second substrate. And it is preferred that the cavity is formed solely in the layer stack of the second substrate and does not reach into the bulk material. In a preferred embodiment, the deformable membrane is built from a third substrate, which is attached to the top layer of the second substrate. The third substrate may, for example, be an SOI (Silicon On Insulator) substrate, wherein specifically the deformable membrane may be built from a silicon layer of the SOI substrate while an insulation layer and bulk material of the SOI substrate are removed during processing. In the first substrate, the contact and the support portion are preferably built by applying one or more grooves vertically through the first substrate. By way of manufacturing the one or more grooves, one or more small portions of the first substrate remain for mechanically linking the support portion to the contact portion. This/these small portion/s act as suspension element/s for suspending the support portion from the contact portion. Preferably, the one or more grooves are arranged vertically in the first substrate, i.e. orthogonal to a plane extension of the first substrate. The suspension element/s may contain ridges, e.g. four ridges that hold the support portion. Preferably, each suspension element is formed integrally with the support portion and the contact portion given that in a preferred embodiment the support portion, the contact portion and the one or more suspension elements are built from the first substrate. In a preferred embodiment, the suspension elements do not represent the shortest path between the contact portion and the support portion but do have a shape that allows one or more of a deflection or a rotation of the support portion relative to the contact portion, e.g. a deflection in at least one direction of the plane of the first substrate. In such way, translational and/or rotational forces applied to the support portion via the cap may be dampened. The suspension elements may contain spring portions for this purpose. Preferably, the deformable membrane itself serves as second electrode and as such contains electrically conducting material. In one embodiment, the second electrode may be a metal layer, or in another embodiment, may be a polysilicon layer. On the other hand, the first electrode which contains the getter material may be arranged near or in the cavity at a stationary position such that this electrode arrangement may allow sensing a capacitance between the first electrode and the deflectable membrane which capacitance is dependent on the distance between the electrodes. For electrically connecting the cap to the first substrate, electrical connections may be provided between the cap and the first substrate, e.g. in form of solder bumps or balls, or other electrically conducting elements that at the same time may also serve as spacer elements for providing the gap between the first substrate and the deformable membrane. In order to connect to the electrically conducting layers in the second substrate, contact windows may be provided into the second substrate and if applicable through the third substrate. On the other hand, the spacer elements may connect to contact pads on the first substrate which may be areas of conducting layers revealed from the first substrate.

Other advantageous embodiments are listed in the dependent claims as well as in the description below.

BRIEF DESCRIPTION OF THE DRAWINGS

Embodiments of the present invention, aspects and advantages will become apparent from the following detailed description thereof. Such description makes reference to the annexed drawings, wherein the figures show:

FIG. 1 a pressure sensor in a sectional view, according to an embodiment of the present invention;

FIGS. 2 to 4 in each, a cutout of a pressure sensor in a sectional view, according to an embodiment of the present invention;

FIGS. 5 to 7 in each, a top view on an electrode of a pressure sensor, according to an embodiment of the present invention;

FIG. 8 a cut along line A-A' of FIG. 6;
FIG. 9 a cut along line B-B' of FIG. 7;
FIG. 10 a zoom-in of area C of FIG. 7, according to a first embodiment of the present invention;
FIG. 11 a zoom-in of area C of FIG. 7, according to a second embodiment of the present invention;
FIG. 13 a bottom view of the first substrate 1 of the pressure sensor of FIG. 12, according to an embodiment of the present invention;
and
FIGS. 14 to 21 in each, a pressure sensor according to an embodiment of the present invention, in diagram a) in a cross section, and in diagram b) a top view on the corresponding first electrode.

DETAILED DESCRIPTION OF THE DRAWINGS

Figure 12:
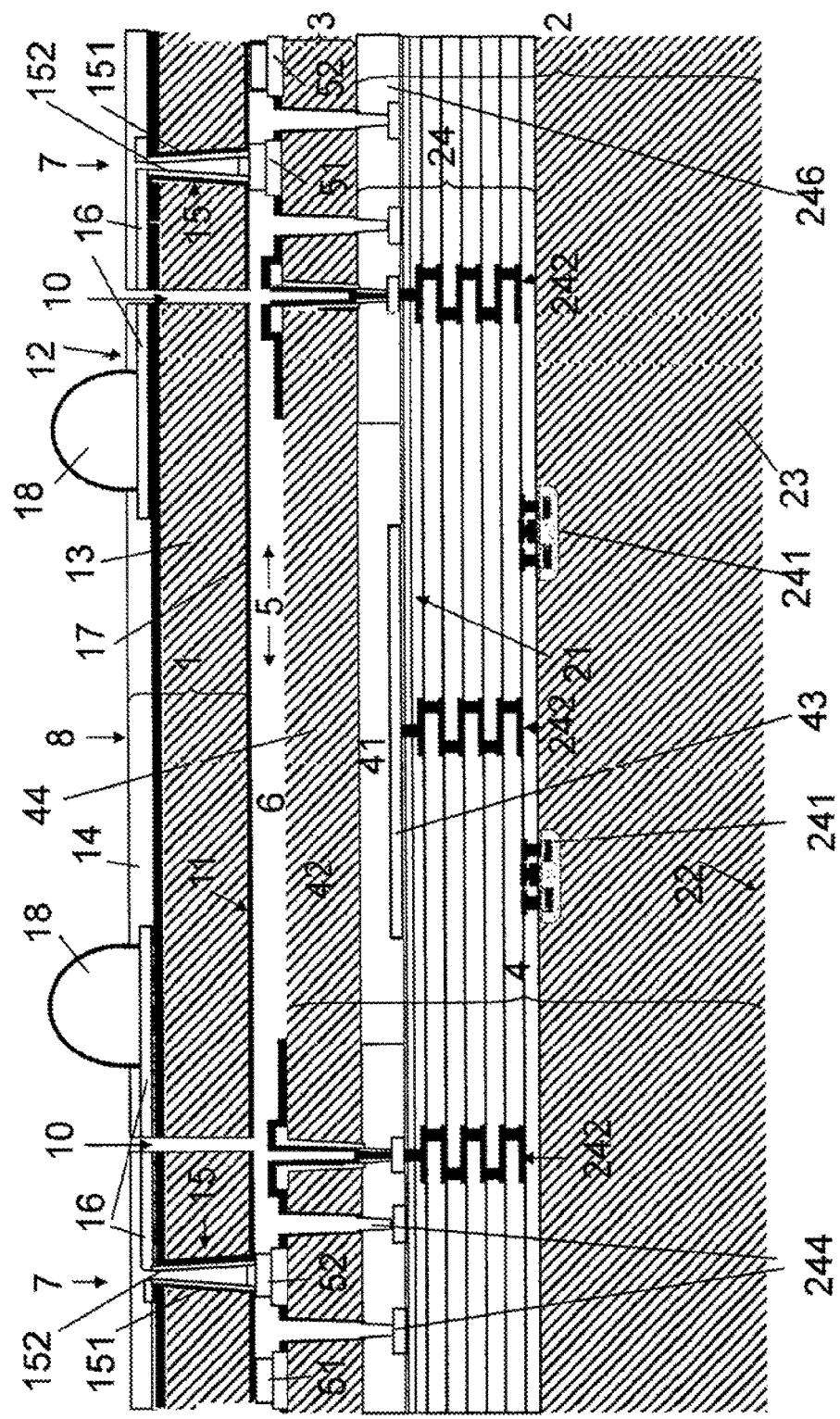
FIG. 12 a sectional view of a pressure sensor according to an embodiment of the present invention.

The term "pressure sensor" as used herein designates any type of sensor measuring a parameter that is equal to or derived from the pressure of a fluid, which fluid shall include a gas and a liquid. In particular, the term designates relative (i.e. differential) as well as absolute pressure sensors, it also covers static as well as dynamic pressure sensors. Typical examples of applications of such sensors are e.g. in scientific instrumentation, meteorology, altitude measurement, sound recording, mobile or portable computers and phones etc.

FIG. 1 illustrates a pressure sensor in a schematic sectional view according to an embodiment of the present invention. The pressure sensor preferably is an integrated pressure sensor, i.e. embodied by means of a substrate, and preferably by a semiconductor substrate such as a silicon substrate, preferably together with a processing circuit (not shown) for at least preprocessing a pressure signal. The pressure sensor comprises a body, which preferably contains a substrate 2, and a deformable membrane 42 spanning a cavity 41 manufactured in the body. The deformable membrane 42 preferably deflects in response to pressure applied to it, such as pressure of the surrounding air, which deflection is in z-direction orthogonal to a plane extension of the pressure sensor in x/y direction. The deflection of the membrane 42 is determined by a capacitive measurement. For this purpose, a first electrode 43 is arranged inside the cavity 41, e.g. at a bottom of the cavity 41, while a second electrode 44 is arranged at or embodied in the membrane 42. A change of a distance d between the first and the second electrode 43 and 44 results in a change in the capacitance between the two electrodes 43 and 44 which is measured by the electrodes 43 and 44. A corresponding signal preferably is supplied to a processing circuit, e.g. integrated together with the sensor in the same chip. Preferably, the cavity 41 is evacuated, such that the pressure sensor is adapted to measure an absolute pressure. One or both of the electrodes 43 and 44 comprise, or are made of a getter material. In the present example, it is assumed that only the first, stationary electrode 43 comprises the getter material.

FIGS. 2 to 4 each shows a cutout of a pressure sensor according to an embodiment of the present invention in a sectional view, e.g. a cutout of the first electrode 43 of the pressure sensor of FIG. 1. In the pressure sensor of each of the FIGS. 2 to 4, it is assumed that the first electrode 43 is arranged on a stack of material layers, e.g. CMOS layers, which at least include an insulating layer 248 arranged on a semiconductor bulk material 23, and a passivation layer 247 arranged on the insulating layer 248. Preferably, the insulating layer 248 is a SiO2 layer, while the passivation layer 247 is a SiNx layer. The first electrode 43 is arranged on the passivation layer 247. The layer stack—which may contain additional insulating and metal layers—and the bulk material 23 preferably contribute to the body of the pressure sensor.

In the embodiment of FIG. 2, the first electrode 43 is solely made from a getter material, e.g. from titanium. The getter material may instead be—and without being limited to the present embodiment—e.g. platinum, or zirconium. In the present embodiment, the getter material is deposited straight on the passivation layer 247.

In the embodiment of FIG. 3, the first electrode 43 is layered. Presently, it contains a first layer 431 and a second layer 432. The second layer 432 is made from the getter material. The first layer 431 is from an electrode material, e.g. from a metal or an alloy different to the getter material, and specifically from aluminum, and preferably from aluminum containing a small amount of copper, i.e. the metal composition of a conducting layer of the material stack in the CMOS process. In the present embodiment, the first layer 431 is deposited straight on the passivation layer 247, and the getter material is deposited on the first layer 431.

The embodiment of FIG. 4 differs from the one of FIG. 3 in that the second layer 432 of getter material is formed as a cap separating the first layer 431 from the cavity. In this example, the first layer 413 is not exposed at all to any molecules to be caught by the getter material, and therefore is fully protected from corrosion.

FIGS. 5 to 7 each show a top view on an electrode of a pressure sensor, according to an embodiment of the present invention. For example, the electrode may be the first electrode 43, 432 and arranged as stationary electrode in the cavity of a pressure sensor, and specifically arranged at the bottom of such cavity. In the present example, the first electrode 43 is of circular shape.

In the embodiment of FIG. 5, the getter material 43 or 432 is applied continuous within the circumference of the first electrode 43.

In the embodiment of FIG. 6, slots 433 are provided in the getter material 432. In a first embodiment, a hard mask may be provided representing the slots in form of ridges which hard mask may be arranged on the passivation layer, or more generally, on the place to build the getter electrode at. The non-getter material if any, and the getter material may be coated or vapor deposited between the ridges of the hard mask. In a different embodiment, the non-getter material if any, and the getter material 43, 432 may be deposited as a continuous layer, and slots 433 may be applied afterwards, e.g. by etching or other processing means.

FIG. 8 is a cut along line A-A' of the first electrode 43 of FIG. 6. In the present example, the first electrode 43 comprises two layers 431 and 432, e.g. an Al/Cu layer 431, and the getter layer 432, e.g. made from titanium. As can be seen from FIG. 8, the slots 433 fully reach through both layers 431 and 432.

In the embodiment of FIG. 7, the first electrode 43 is made from individual elements 434 represented by small squares each. The elements 434 are electrically connected with each other. Each element 434 at least is electrically connected to one other element 434 in order to insure the electrical connectivity of the overall first electrode 43. Preferably, an element 434 is electrically connected via an electrically conducting bridge to at least one of the neighboring elements 434, and preferably to all of the neighboring elements 434 as is shown in FIG. 10 which is a zoom-in of area C of FIG. 7 in top view. Nine elements 434 are zoomed wherein each of these elements 434 is connected to each of the neighboring elements 434 by means of V-shaped bridges 435 which in addition act as springs. FIG. 11 shows the zoom-in of area C of FIG. 7 according to a second embodiment of the present invention. Here, the individual elements 44 are connected with each other via bridges 435 that are shaped different than the bridges of FIG. 10. Again, the bridges 435 also act as springs.

FIG. 9 is a cut along line B-B' of FIG. 7. In the present example, the electrode 43 comprises two layers 431 and 432, e.g. an Al/Cu layer 431, and the getter layer 432, e.g. made from titanium. As can be seen from FIG. 10 or FIG. 11, the individual elements 434 are separated from each other except for the electrically conducting bridges 435. The bridges 435 serve for electrically connecting all individual elements 434, such that the entire electrode 43 requires only a single electrical contact.

As to the manufacturing of the individual elements 434, in a first embodiment a hard mask may be provided in form of a grid which hard mask may be arranged on the passivation layer, or more generally, on the place to build the getter electrode at. The non-getter material if any, and getter material may be coated or vapor deposited into the openings of the grid. In a different embodiment, the non-getter material if any, and the getter material 432 may be deposited both as a continuous layer, and may be separated into individual elements 434 afterwards, e.g. by etching or other processing means.

FIG. 12 shows a schematic sectional view of a pressure sensor in accordance with an embodiment of the present invention. The pressure sensor as shown is flipped with its solder balls 18 showing upwards while the pressure sensor will be mounted to a carrier with its solder balls 18 sitting on the carrier. The pressure sensor includes a first substrate 1 and a cap 4 for the first substrate 1. The cap 4 preferably is made from a second substrate 2 and a third substrate 3. The second substrate 2 preferably is a semiconductor substrate, preferably a silicon substrate, and has a front side 21 and a backside 22. The second substrate 2 contains a bulk material 23 of, e.g. silicon and a stack of layers 24 on the bulk material 23. These layers 24 may be arranged for CMOS processing of the second substrate 2, and as such may also be denoted as CMOS layers or material layers. Specifically, the layers 24 can include for example a plurality of SiO2 layers, metal or polysilicon layers. The bulk material 23 may contain doped regions within the silicon such as indicated by the reference sign 241. These components can form active circuitry, such as amplifiers, A/D converters or other analog and/or digital signal processing units. A top layer 246 of the stack of layers 24 may be a dielectric layer of silicon oxide and/or silicon nitride protecting the structures below it. In the present example, it is assumed that a processing circuit collectively referred to as 241 is integrated on the front side 21 of the second substrate 2 by means of CMOS processing.

In the cap 4, a cavity 41 is formed by omitting or removing material from one or more of the layers 24, presently the top layer 246. The cavity 41 is closed by a deformable membrane 42. The membrane 42 is sufficiently thin such that it deforms depending on a pressure drop between a pressure at the top of the membrane 42 and below it. A metal layer of the layer stack 24 may be used as a first stationary electrode 43, and as such may be arranged at the bottom of the cavity 41. The first stationary electrode 43 is entirely made from a getter material in this embodiment.

The membrane 42 preferably is formed by a doped, conducting silicon layer, is arranged as a sealing lid over the cavity 41, and may be used as a second electrode 44 for which reason the deformable membrane 42 may contain electrically conducting material. Hence upon a change in pressure the membrane 42 deflects and as such a distance between the two electrodes 43 and 44 changes which results in a change of the capacitance between the two electrodes 43 and 44.

In the present example, the deformable membrane 42 is built from a third substrate 3. The third substrate 3 as shown in FIG. 12 may be the remainder of an SOI substrate, specifically its device layer after some manufacturing steps. The third substrate 3 not only may contribute to the deformable membrane 42. The third substrate 3 may contain contact windows 244 reaching through which may also reach into one or more of the layers 24.

Corresponding signals may be transmitted from the electrodes 43 and 44 via electrical paths 242 to the processing circuit 241 where these signals are processed. Signals processed by the processing circuit 241 may be supplied to the first substrate 1.

The first substrate 1 may be a semiconductor substrate, e.g. a silicon substrate, or a glass substrate, for example, with a front side 11 and a back side 12. The semiconductor substrate 1 includes bulk material 13 such as silicon, and one or more layers 14, such as an oxide layer on the bulk material 13. The one or more layers 14 may further include for example a plurality of SiO2 layers, metal or polysilicon layers.

The first substrate 1 contains vias 15 reaching vertically through the first substrate 1. Those vias 15 provide for an electrical connection from the front side 11 of the substrate 1 to its backside 12. Those vias 15 are manufactured by etching or drilling holes into the first substrate 1 from its backside 12, by applying an oxide 151 to the hole, and by applying conducting material 152 to the oxide 151. At the back side 12 of the first substrate 1, the vias 15 are electrically connected to contact pads 16 residing on an oxide layer 17 applied to the bulk material 13, which contact pads 16 serve as support for solder balls 18 or other contact means for electrically connecting the pressure sensor to the outside world, i.e. to another device. Alternative to the vias 15 and the solder balls 18, there may be other ways of interconnecting the pressure sensor to the outside world, e.g. by means of wire bonds, bond pads or conducting structures that lead from the front side 11 of the first substrate 1 along its sides to the backside 12. The electrical connection to the outside world may also be implemented via one or more of a Land Grid Array, a Pin Grid Array, or a leadframe.

The assembly containing the second and the third substrate 2, 3 is attached to the front side 11 of the first substrate 1. The attachment may include bonding or other fusion techniques. In the present example, spacer elements 5 are provided between the third substrate 3 and the first substrate 1. The spacer elements 5 may have different functions: On the one hand, the spacer elements 5 provide for a gap 6 between the deformable membrane 42 and the first substrate 1 which is required for supplying the pressure medium to the membrane 42. On the other hand, some of the spacer elements 5, but not necessarily all may be electrically conductive for connecting the contact windows 244 to the first substrate 1. Other or the same spacer elements 5 may provide mechanical stability for the stacking of substrates 1, 3, and/or may provide mechanical protection to the inside of the pressure sensor, and specifically to the membrane 42. For this purpose, it may be preferred, that a spacer element 51 is arranged in from of a ring at the edges of the substrates 1,3 providing mechanical stability, protection as well as an electrical connection, while spacer elements 52 are rather pillar-like and provide electrical connections.

The signals provided by the processing circuit 241 hence may be transferred via one or more of the electrical paths 242 and via one or more of the contact windows 244 to one or more of the spacer elements 5. As shown in FIG. 12, the spacer elements 52 end at the vias 15 of the first substrate 1 and are electrically connected thereto. Hence, the signals are conducted through the vias 15 to the contact pads 16 and the solder balls 18.

The first substrate 1 contains a support portion 7 and a contact portion 8. Suspension elements not shown in the present illustration are provided for suspending the support portion 7 from the contact portion 8. The support portion 7 preferably encircles the contact portion 8 in a plane of the first substrate 1.

The contact portion 8 is separated from the support portion 7 by one or more grooves 10. Owed to the manufacturing of the contact portion 8 and the support portion 7 from the common first substrate 1, both portions may include bulk material 13 from the first substrate 1.

The cap 4 preferably is exclusively attached to the support portion 7 of the first substrate 1 via the spacer elements 5. On the other hand, it is preferred that it is solely the contact portion that provides a mechanical and electrical contact to the outside world. Hence, the portion of the pressure sensor via which mechanical stress is induced, i.e. the contact portion 8 is mechanically decoupled from the rest of the pressure sensor and specifically from the deformable membrane 42 by way of the suspension elements.

A port for conducting a medium to the deformable membrane 42 in the present example encompasses the grooves 10 and the gap 6, or at least parts of.

The overall height of the pressure sensor in the present example is about 400 μm.

FIG. 13 illustrates a bottom view onto the first substrate 1 of the pressure sensor of FIG. 12. The first substrate 1 contains a support portion 7 and a contact portion 8 wherein the support portion 7 is suspended from the contact portion 8 by means of a suspension element 9, which is a representation of a mechanical link between the two portions 7 and 8. A groove 10 is arranged vertically through the first substrate 1. Vias 15 are arranged in the support portion 7, while the solder balls 18 are arranged in the contact portion 8. The contact portion 8 is electrically connected to the support portion 7 by means of electrically conducting structures such as the contact pads 16 which electrically conducting structures may in generally be denoted as redistribution layer.

FIGS. 14 to 21 each shows a pressure sensor according to an embodiment of the present invention, in diagram b) in a cross section, and in diagram b) in a top view on the corresponding first electrode 43. For the present embodiments, it is assumed that the pressure sensor may contain a structural set-up identical or similar to the embodiments shown in FIG. 1 or 12. Hence, a cavity 41 is formed by means of a membrane 42 facing a substrate containing silicon as bulk material 23 and a stack of layers on top of the bulk material 23. In a top most layer 246, which presently may be an oxide layer such as a SiO2 layer, a recess is built for forming the cavity 41. The top most layer 246 may be arranged on a passivation layer 247, such as a SiNx layer which in turn is arranged on an oxide layer 248. Other layers, such as further CMOS layers may be present in the stack of layers. In all the present examples, a first electrode 43 is arranged at a bottom of the cavity 41, while a second electrode not further shown may be integrated, arranged on or otherwise coupled to the deflectable membrane 42. Contact windows 244 are arranged in the top most layer 246 and the anchorage of the membrane 42.

In FIG. 14, the first electrode 43 comprises a center portion 436 including a stack of a first layer 431 of electrically conducting material, specifically a non-getter material, such as Al—Cu, which may be made from a metal layer of the CMOS layer stack and of a second layer 432 arranged on top of the first layer 431 and covering a top surface of the first layer 431 entirely. The second layer 432 is a continuous film as can be derived from diagram 14a). Outside the layered center portion 436 and separated by a gap, the first electrode 43 further comprises a ring portion 437 of getter material which is directly applied to the passivation layer 247 or another layer of the stack of layers. This ring portion 437 lacks the first layer material 431 underneath. By such means, the surface of the getter material can be enhanced, thereby improving the capacitance of catching gas molecules. As can be derived from diagram 14a), an electrical contact 438 is provided for contacting the ring portion 436 which ring portion 436 on the other hand is electrically connected to the layered portion 436 (not shown). Such connection may be e.g. implemented by means of a metal layer in the stack of layers underneath the ring portion and the layered portion. Hence, in an embodiment of the present invention, the first electrode 43 comprising the getter material is split into a central portion 436 and a ring portion around 437 the center portion, wherein the center portion 436 is a layered while the ring portion 437 is non-layered. Preferably, the first electrode 43 is arranged centered in the cavity 41, and preferably at the bottom of the cavity 41.

The first electrode 43 in FIG. 15 solely comprises the centered, layered portion 436 of the first electrode 43 of FIG. 14. Hence, a stack is provided comprising a first layer 431 of electrically conducting non-getter material, such as Al—Cu, and a second layer 432 comprising the getter material arranged on top of the first layer 431 and covering a top surface of the first layer 431 entirely. Again, the second layer 432 is a continuous film as can be derived from diagram 15a).

The first electrode 43 in FIG. 16 solely comprises getter material in the ring portion 437 of the first electrode 43 of FIG. 14. Instead, the center portion 436 is not layered, and only the first layer 431 containing non-getter material is provided in the center portion 436. Again, it is assumed that the electrical contact 438 reaches via the ring portion 436 to the first layer 431 which is not shown in the top view of diagram 16a) which diagrams a) only indicate any getter material in top view.

The first electrodes 43 in FIGS. 17 to 19 comprise slotted getter material portions. The first electrode 43 of FIG. 17 resembles the first electrode 43 of FIG. 14 and as such comprises a layered center portion 436 and a ring portion 437 around the center portion 436. However, both the layered center portion 436 and the ring portion 437 comprise slots 433 in the getter material as introduced in connection with the embodiment of FIG. 6. In the ring portion 437 as well as in the center portion 436, the slots 433 reach through the getter material and through the first layer 431. In a different embodiment, the slots 433 reach only through the getter material but not through the first layer 431.

The first electrode 43 in FIG. 18 solely comprises the layered center portion 436 of the first electrode 43 of FIG. 17. Hence, a stack of a first layer 431 of electrically conducting non-getter material, such as Al—Cu, and of a second layer 432 comprising the getter material is manufactured. Again, the second layer 432 is slotted, and the first layer 431 preferably is slotted, too.

The first electrode 43 in FIG. 19 solely comprises getter material in the ring portion 437 of the first electrode 43 of FIG. 17. The center portion 436 is not layered and only comprises the first layer 431 containing non-getter material. Again, it is assumed that the electrical contact 438 reaches via the ring portion 437 to the first layer 431. The ring portion 437 comprises slots 433.

The first electrode 43 in FIG. 20 resembles the first electrode 43 of FIG. 14. However, the second layer 432 of the center portion 436 additionally covers the sides of the first layer 431 and hence forms a cap for the first layer 431 such that the first layer 431 is not exposed to gaseous components.

The first electrode 43 in FIG. 21 resembles the first electrode 43 of FIG. 15. Again, no ring portion is provided, but the center portion is layered comprising the getter material containing second layer 432 continuously deposited on the first layer 431. However, as in the embodiment of FIG. 20, the second layer 432 additionally covers the sides of the first layer 431 and hence forms a cap for the first layer 431 such that the first layer 431 is not exposed to gaseous components.

While above there are shown and described embodiments of the invention, it is to be understood that the invention is not limited thereto but may be otherwise variously embodied and practiced within the scope of the following claims.

What is claimed is:

1. A sensor comprising
   a deformable membrane deflecting in response to a stimuli; and
   a capacitive element coupled to the deformable membrane, wherein the capacitive element is disposed within an enclosed cavity of the sensor, and wherein the capacitive element changes capacitance in response to the deformable membrane deflecting, and wherein the capacitive element comprises a getter material for collecting gas molecules within the enclosed cavity.

2. The sensor as described in claim 1, wherein the stimuli is external pressure.

3. The sensor as described in claim 1, wherein the enclosed cavity is formed by the deformable membrane, a dielectric material, and a semiconductor substrate.

4. The sensor as described in claim 3, wherein the semiconductor substrate is a CMOS substrate.

5. The sensor as described in claim 1, wherein the capacitive element comprises a first electrode and a second electrode.

6. The sensor as described in claim 5, wherein the first electrode is disposed on a semiconductor substrate and comprises the getter material, and wherein the first electrode is fixed and immovable responsive to the stimuli.

7. The sensor as described in claim 5, wherein a material of the first electrode is selected from a group consisting of titanium, platinum, and zirconium.

8. The sensor as described in claim 5, wherein the first electrode comprises a center portion and a ring portion around the center portion, wherein electrical connection is made through the center portion, and wherein the ring portion comprises the getter material.

9. The sensor as described in claim 8, wherein the center portion comprises a first layer overlaying a second layer, wherein the second layer comprises non-getter conducting material, and wherein the first layer comprises the getter material, and wherein the ring portion exclusively comprises the getter material.

10. The sensor as described in claim 8, wherein the ring portion and the center portion comprise slots.

11. The sensor as described in claim 5, wherein the first electrode is ring shaped, and wherein the first electrode comprises a first layer overlaying a second layer, wherein the second layer comprises non-getter conducting material, and wherein the first layer comprises the getter material.

12. The sensor as described in claim 5, wherein the first electrode comprises a plurality of elements, wherein neighboring elements of the plurality of elements are coupled to one another through a V-shaped bridge.

13. The sensor as described in claim 5 further comprising a cavity, wherein the deformable membrane separates the cavity and a port open to an outside of the sensor, and wherein the first electrode is positioned at a bottom of the cavity facing the deformable membrane.

* * * * *